US008946353B2

(12) United States Patent
Yoshitake et al.

(10) Patent No.: US 8,946,353 B2
(45) Date of Patent: Feb. 3, 2015

(54) CURABLE ORGANOPOLYSILOXANE COMPOSITION, OPTICAL SEMICONDUCTOR ELEMENT SEALANT, AND OPTICAL SEMICONDUCTOR DEVICE

(75) Inventors: Makoto Yoshitake, Funabashi (JP); Takashi Sagawa, Ichihara (JP); Masayoshi Terada, Ichihara (JP)

(73) Assignee: Dow Corning Toray Co. Ltd., Chiyoda-Ku, Tokyo (JP)

( * ) Notice: Subject to any disclaimer, the term of this patent is extended or adjusted under 35 U.S.C. 154(b) by 938 days.

(21) Appl. No.: 13/126,440

(22) PCT Filed: Oct. 30, 2009

(86) PCT No.: PCT/JP2009/069014
§ 371 (c)(1),
(2), (4) Date: Jul. 11, 2011

(87) PCT Pub. No.: WO2010/050625
PCT Pub. Date: May 6, 2010

(65) Prior Publication Data
US 2011/0254047 A1 Oct. 20, 2011

(30) Foreign Application Priority Data
Oct. 31, 2008 (JP) ................................. 2008-281243

(51) Int. Cl.
*H01L 33/52* (2010.01)
*C08G 77/38* (2006.01)
*H01L 23/29* (2006.01)
*C08L 83/04* (2006.01)
*C08G 77/12* (2006.01)
*C08G 77/20* (2006.01)
*C08G 77/00* (2006.01)

(52) U.S. Cl.
CPC ............... *H01L 23/296* (2013.01); *C08L 83/04* (2013.01); *C08G 77/12* (2013.01); *C08G 77/20* (2013.01); *C08G 77/70* (2013.01); *H01L 2924/09701* (2013.01); *H01L 2924/12044* (2013.01)
USPC .................... 525/100; 525/478; 257/E33.059

(58) Field of Classification Search
USPC ........................... 525/100, 478; 257/E33.059
See application file for complete search history.

(56) References Cited

U.S. PATENT DOCUMENTS 5,661,210 A * 8/1997 Burns et al. ................... 524/493
6,806,509 B2 10/2004 Yoshino et al.
7,527,871 B2 5/2009 Morita et al.
7,763,697 B2 7/2010 Kato et al.
7,842,755 B2 11/2010 Morita et al.
2009/0179180 A1 7/2009 Morita et al.

FOREIGN PATENT DOCUMENTS

| JP | 2003128922 A | 5/2003 |
| JP | 2004292807 A | 10/2004 |
| JP | 2005105217 A | 4/2005 |
| JP | 2006063092 A | 3/2006 |
| JP | 2007103494 | 4/2007 |
| JP | 2008001828 A | 1/2008 |
| WO | WO 2006011676 A1 | 2/2006 |
| WO | WO 2007100445 A2 | 9/2007 |
| WO | WO 2010027105 A1 | 3/2010 |

OTHER PUBLICATIONS

English language abstract for JP 2003128922 extracted from the espacenet.com database on Sep. 13, 2011, 11 pages.
English language abstract for JP 2004292807 extracted from the espacenet.com database on Sep. 13, 2011, 20 pages.
English language abstract for JP 2005105217 extracted from the espacenet.com database on Sep. 13, 2011, 20 pages.
English language abstract for JP 2006063092 extracted from the espacenet.com database on Sep. 13, 2011, 35 pages.
English language abstract and translation for JP 2007103494 extracted from the PAJ database on Sep. 13, 2011, 85 pages.
English language abstract for JP 2008001828 extracted from the espacenet.com database on Sep. 13, 2011, 17 pages.
International Search Report for Application No. PCT/JP2009/065885 dated Dec. 2, 2009, 3 pages.
International Search Report for Application No. PCT/JP2009/069014 dated Feb. 1, 2010, 3 pages.

* cited by examiner

*Primary Examiner* — Ling Choi
*Assistant Examiner* — Chun-Cheng Wang
(74) *Attorney, Agent, or Firm* — Howard & Howard Attorneys PLLC

(57) ABSTRACT

A hydrosilylation reaction-curable organopolysiloxane composition comprising (A) a methylpheny-lalkenylpolysiloxane that has at least two alkenyl groups wherein diphenylsiloxane units are no more than 5 mole % and at least 20 mole % is comprised of phenyl groups, (B) a methylphenylhydrogen-polysiloxane that has at least two Si-bonded hydrogen atoms wherein diphenylsiloxane units are no more than 5 mole % and at least 20 mole % is comprised of phenyl groups, and (C) a hydrosilylation reaction catalyst. An optical semiconductor element sealant comprising this composition. An optical semiconductor device sealed with this optical semiconductor element sealant.

18 Claims, 1 Drawing Sheet

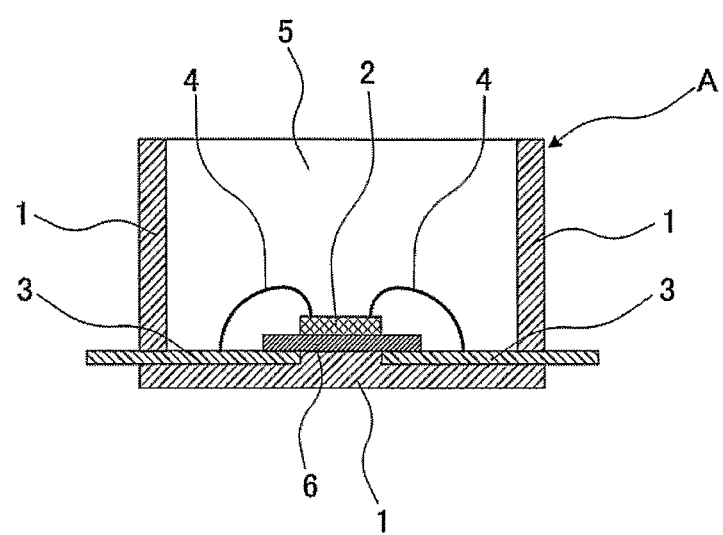

US 8,946,353 B2

CURABLE ORGANOPOLYSILOXANE COMPOSITION, OPTICAL SEMICONDUCTOR ELEMENT SEALANT, AND OPTICAL SEMICONDUCTOR DEVICE

RELATED APPLICATIONS

This application claims priority to and all the advantages of International Patent Application No. PCT/JP2009/069014, filed on Oct. 30, 2009, which claims priority to Japanese Patent Application No. JP2008-281243, filed on Oct. 31, 2008.

TECHNICAL FIELD

The present invention relates to a hydrosilylation reaction-curable organopolysiloxane composition, an optical semiconductor element sealant, specifically encapsulant comprising this composition, and an optical semiconductor device in which an optical semiconductor element is sealed, specifically encapsulated with the optical semiconductor element sealant, specifically encapsulant.

BACKGROUND ART

Curable organopolysiloxane compositions that cure by the hydrosilylation reaction are used as, for example, sealants—including protective coatings—for optical semiconductor elements in optical semiconductor devices such as photocouplers, light-emitting diode devices, solid-state imaging devices, and so forth. Since these optical semiconductor elements emit or receive light, these optical semiconductor element sealants—including protective coatings—must not absorb or scatter light.

As a consequence, Patent References 1 to 5 provide hydrosilylation reaction-curable organopolysiloxane compositions that, through the use of an organopolysiloxane having a high phenyl content, are able to form cured products that exhibit a high refractive index and a high optical transmittance.

However, the present inventors noted that these curable organopolysiloxane compositions had the following problems: their cured products do not always exhibit a high optical transmittance; they exhibit a poor durability of adhesion for the semiconductor element, lead frame, or package in contact with the composition during its cure, resulting in facile detachment; and their cured products yellow during long-term residence at high temperature, resulting in a decline in the optical transmittance. The present inventors also noted the problems of a poor durability of adhesion and an unsatisfactory reliability in the case of semiconductor devices provided with a semiconductor element that has been coated or sealed with these curable organopolysiloxane compositions and optical semiconductor devices provided with an optical semiconductor element that has been coated or sealed with these curable organopolysiloxane compositions.

A curable organopolysiloxane composition that solves the problem of a reduced durability of adhesion is disclosed in Patent Reference 6. However, the present inventors noted the following problem with this curable organopolysiloxane composition: because an essential component of this composition is a radical copolymer-type adhesion promoter, when an optical semiconductor element coated or sealed with a cured product from this composition is subjected to long-term use at high temperatures, this cured product undergoes yellowing and the optical transmittance declines.

[Patent Reference 1] JP 2003-128922 A
[Patent Reference 2] JP 2004-292807 A
[Patent Reference 3] JP 2005-105217 A
[Patent Reference 4] JP 2007-103494 A
[Patent Reference 5] JP 2008-001828 A
[Patent Reference 6] JP 2006-063092 A

DISCLOSURE OF THE INVENTION

Problems to Be Solved by the Invention

An object of the present invention is to provide a curable organopolysiloxane composition that forms a cured product that exhibits a high refractive index, a high optical transmittance, and a high resistance to discoloration.

A further object of the present invention is to provide an optical semiconductor element sealant that forms a cured product that exhibits a high refractive index, a high optical transmittance, and a high resistance to discoloration.

A further object of the present invention is to provide a highly reliable optical semiconductor device in which, for example, an optical semiconductor element, lead frame, package, and so forth, are sealed with the cured product from an optical semiconductor element sealant wherein the cured product exhibits a high refractive index, a high optical transmittance, and a high resistance to discoloration.

Another object of the present invention is to provide a curable organopolysiloxane composition that forms a cured product that exhibits a high refractive index, a high optical transmittance, a high resistance to discoloration, and a highly durable adhesion to the various substrates, e.g., a semiconductor element, lead frame, package, and so forth, in contact with the composition during its cure.

An additional object of the present invention is to provide an optical semiconductor element sealant that forms a cured product that exhibits a high refractive index, a high optical transmittance, a high resistance to discoloration, and a highly durable adhesion to, for example, an optical semiconductor element, lead frame, package, and so forth, in contact with the sealant during the sealant's cure.

A further object of the present invention is to provide a highly reliable optical semiconductor device that is sealed with the cured product from an optical semiconductor element sealant wherein this cured product exhibits a highly durable adhesion to, for example, optical semiconductor elements, lead frames, packages, and so forth, and also exhibits a high refractive index, a high optical transmittance, and a high resistance to discoloration.

Means Solving the Problem

The aforementioned objects are achieved by
"[1] A hydrosilylation reaction-curable organopolysiloxane composition comprising
(A) a methylphenylalkenylpolysiloxane that has at least two silicon-bonded alkenyl groups per molecule, wherein diphenylsiloxane units are no more than 5 mole % of the total siloxane units and phenyl groups are at least 20 mole % of the total silicon-bonded organic groups in the molecule,
(B) a methylphenylhydrogenpolysiloxane that has at least two silicon-bonded hydrogen atoms per molecule, wherein diphenylsiloxane units are no more than 5 mole % of the total siloxane units and phenyl groups are at least 20 mole % of the total silicon-bonded organic groups in the molecule, and
(C) a hydrosilylation reaction catalyst, wherein diphenylsiloxane units are no more than 5 mole % of the total siloxane units in this composition.

[2] The hydrosilylation reaction-curable organopolysiloxane composition according to [1], characterized in that component (A) is represented by average unit formula (1):

$$R_a SiO_{(4-a)/2} \quad (1)$$

wherein R is $C_2$ to $C_8$ alkenyl, methyl, and phenyl, at least 20 mole % thereof is comprised of phenyl groups, and a is a positive number from 0.5 to 2.2; and
component (B) is represented by average unit formula (5):

$$R^1_b H_c SiO_{(4-b-c)/2} \quad (5)$$

wherein $R^1$ is methyl and phenyl, at least 20 mole % thereof is comprised of phenyl groups, b is a positive number from 1.0 to 2.2, and c is a positive number from 0.002 to 1.0.

[3] The hydrosilylation reaction-curable organopolysiloxane composition according to [2], characterized in that component (A) is a mixture of
(A1) a methylphenylalkenylpolysiloxane represented by average unit formula (2):

$$R_d SiO_{(4-d)/2} \quad (2)$$

wherein R is $C_2$ to $C_8$ alkenyl, methyl, and phenyl, at least 20 mole % thereof is comprised of phenyl groups, and d is a positive number from 1.9 to 2.2 that has at least two silicon-bonded $C_2$ to $C_8$ alkenyl groups per molecule, is liquid at ambient temperature and has a viscosity at 25° C. of 10 to 100,000 mPa·s, with the proviso that diphenylsiloxane units are no more than 5 mole % of the total siloxane units therein, and
(A2) an organopolysiloxane resin represented by average unit formula (3):

$$R_e SiO_{(4-e)/2} \quad (3)$$

wherein R is $C_2$ to $C_8$ alkenyl, methyl, and phenyl, at least 20 mole % thereof is comprised of phenyl groups, and e is a positive number from 0.5 to 1.7, and that is a solid at ambient temperature and has at least two silicon-bonded alkenyl groups per molecule, with the proviso that diphenylsiloxane units are no more than 5 mole % of the total siloxane units therein,
wherein component (A1) is 99 to 30 weight % of the mixture and component (A2) is 1 to 70 weight % of the mixture and their total is 100 weight %.

[4] The hydrosilylation reaction-curable organopolysiloxane composition according to [1] or [2], characterized in that neither component (A) nor component (B) contains the diphenylsiloxane unit.

[5] The hydrosilylation reaction-curable organopolysiloxane composition according to [3], characterized in that neither component (A1) nor component (A2) nor component (B) contains the diphenylsiloxane unit.

[6] The hydrosilylation reaction-curable organopolysiloxane composition according to [1], [2], or [4], characterized in that said composition forms a cured product that has an optical transmittance of at least 90% in a quartz cell at a wavelength of 450 nm and an optical path length of 0.2 cm and that has a refractive index at 25° C. for visible light at 589 nm of at least 1.5.

[7] The hydrosilylation reaction-curable organopolysiloxane composition according to [3] or [5], characterized in that said composition forms a cured product that has an optical transmittance of at least 90% in a quartz cell at a wavelength of 450 nm and an optical path length of 0.2 cm and that has a refractive index at 25° C. for visible light at 589 nm of at least 1.5.

[8] The hydrosilylation reaction-curable organopolysiloxane composition according to [6] Or [7], characterized in that the cured product has an optical transmittance of at least 98% at 25° C. at an optical path length of 0.2 cm and a wavelength of 450 nm after the cured product has been held for 1000 hours in a 150° C. convection oven.".

The aforementioned objects are also achieved by
[9] An optical semiconductor element sealant comprising the hydrosilylation reaction-curable organopolysiloxane composition according to [6].
[10] An optical semiconductor element sealant comprising the hydrosilylation reaction-curable organopolysiloxane composition according to [7].
[11] The optical semiconductor element sealant according to [9] or [10], characterized in that said sealant forms a cured product that has an optical transmittance at 25° C. of at least 99% at a wavelength of 450 nm and an optical path length of 0.2 cm, wherein this cured product has an optical transmittance at 25° C. of at least 98% at a wavelength of 450 nm and an optical path length of 0.2 cm after the cured product has been held for 1000 hours in a 150° C. convection oven.".

The aforementioned objects are also achieved by
"[12] An optical semiconductor device, characterized in that the optical semiconductor element of an optical semiconductor device comprising an optical semiconductor element in a housing is sealed with the transparent cured product from the optical semiconductor element sealant according to [9], [10] or [11] by filling the optical semiconductor element sealant into the housing and curing.
[13] The optical semiconductor device according to [12], characterized in that the optical semiconductor element is a light-emitting diode element and the optical semiconductor device is a light-emitting diode device.
[14] The optical semiconductor device according to [12] or [13], characterized in that the housing is composed of a polar group-containing plastic.
[15] The optical semiconductor device according to [14], characterized in that the polar group-containing plastic is polyphthalamide resin.".

The aforementioned objects are also achieved by
"[16] The hydrosilylation reaction-curable organopolysiloxane composition according to any of [1] to [5], characterized in that its total content of 1,3,5-trimethyl-1,3,5-triphenylcyclotrisiloxane and 1,3,5,7-tetramethyl-1,3,5,7-tetraphenylcyclotetrasiloxane is no more than 5 weight %.
[17] The optical semiconductor element sealant according to [9], [10], or [11], characterized in that its total content of 1,3,5-trimethyl-1,3,5-triphenylcyclotrisiloxane and 1,3,5,7-tetramethyl-1,3,5,7-tetraphenylcyclotetrasiloxane is no more than 5 weight %.
[18] An optical semiconductor device, characterized in that the light-emitting semiconductor element of an optical semiconductor device comprising an optical semiconductor element in a housing is sealed with the transparent cured product from the optical semiconductor element sealant according to [17] by filling the optical semiconductor element sealant into the housing and curing.".

Effects of the Invention

The curable organopolysiloxane composition according to claims 1 to 8 of the present invention forms a cured product that exhibits a high refractive index, a high optical transmittance, and a high resistance to discoloration.

The optical semiconductor element sealant according to claims 9 to 11 of the present invention forms a cured product that exhibits a high refractive index, a high optical transmittance, and a high resistance to discoloration.

The optical semiconductor device according to claims 12 to 15 of the present invention —because the optical semiconductor element and so forth therein is sealed with a cured product from the aforementioned optical semiconductor element sealant—exhibits a high refractive index, a high optical transmittance, and a high resistance to discoloration and an excellent reliability.

The curable organopolysiloxane composition according to claim 16 of the present invention forms a cured product that exhibits a high refractive index, a high optical transmittance, a high resistance to discoloration, and a highly durable adhesion with respect to any of various substrates, e.g., a semiconductor element, lead frame, package, and so forth, in contact with the composition during its cure.

The optical semiconductor element sealant, specifically encapsulant according to claim 17 of the present invention forms a cured product that exhibits a high refractive index, a high optical transmittance, a high resistance to discoloration, and a highly durable adhesion with respect to, for example, an optical semiconductor element, lead frame, package, and so forth, in contact with the sealant, specifically encapsulant during its cure.

The optical semiconductor device according to claim 18 of the present invention—because, for example, the optical semiconductor element and so forth therein is sealed, specifically encapsulated with a cured product from the aforementioned optical semiconductor element sealant, specifically encapsulant—exhibits a high refractive index, a high optical transmittance, and a high resistance to discoloration and an excellent reliability.

BRIEF DESCRIPTION OF THE DRAWINGS

FIG. 1 is a cross-sectional diagram of a surface mount-type light-emitting diode (LED) device A that is a representative example of the optical semiconductor device of the present invention.

MODE FOR CARRYING OUT THE INVENTION

The curable organopolysiloxane composition of the present invention and the optical semiconductor element sealant, specifically encapsulant of the present invention will be described in detail first.

The curable organopolysiloxane composition of the present invention comprises (A) a methylphenylalkenylpolysiloxane that has at least two silicon-bonded alkenyl groups per molecule, wherein diphenylsiloxane units are no more than 5 mole % of the total siloxane units and the phenyl group is at least 20 mole % of the total silicon-bonded organic groups in the molecule, (B) a methylphenylhydrogenpolysiloxane that has at least two silicon-bonded hydrogen atoms per molecule, wherein diphenylsiloxane units are no more than 5 mole % of the total siloxane units and the phenyl group is at least 20 mole % of the total silicon-bonded organic groups in the molecule, and (C) a hydrosilylation reaction catalyst.

The hydrosilylation reaction-curable organopolysiloxane composition of the present invention cures through a hydrosilylation reaction between the silicon-bonded alkenyl groups in component (A) and the silicon-bonded hydrogen atoms in component (B) under the catalytic action of component (C). The methylphenylalkenylpolysiloxane constituting this component (A) has at least two silicon-bonded alkenyl groups per molecule; in addition, diphenylsiloxane units are no more than 5 mole % of its total siloxane units and the phenyl group is at least 20 mole % of the total silicon-bonded organic groups in its molecule.

The silicon-bonded $C_2$ to $C_8$ alkenyl in component (A) is exemplified by vinyl, allyl, butenyl, pentenyl, and hexenyl, with vinyl being preferred from the standpoints of the ease of component (A) production and the hydrosilylation reactivity.

Since curing occurs through the hydrosilylation reaction of component (A) with component (B), at least two silicon-bonded $C_2$ to $C_8$ alkenyl groups must be present in one molecule. When component (A) has a straight chain molecular structure, the silicon-bonded $C_2$ to $C_8$ alkenyl is present only at both terminals, both in side chain position and at both terminals, or only in side chain position. When component (A) has a branched molecular structure, the silicon-bonded $C_2$ to $C_8$ alkenyl is present, for example, only in terminal position, both in side chain position and at both terminals, only in side chain position, or at branch points. Ordinarily only one $C_2$ to $C_8$ alkenyl group is bonded to a single silicon atom, but two or three may be bonded to a single silicon atom.

The silicon-bonded phenyl group in component (A) provides the cured product generated by the hydrosilylation reaction between components (A) and (B) with a low light attenuation due to refraction, reflection, scattering, and so forth, and for this reason the content of silicon-bonded phenyl group in component (A), considered with respect to the total silicon-bonded organic groups in component (A), is at least 20 mole % and preferably is at least 30 mole % and more preferably is at least 40 mole %. An overly large phenyl content results in a decline in transparency due to turbidity in the composition and the phenyl content is therefore preferably no more than 80 mole %.

The silicon-bonded phenyl group in component (A) can be present in the form of the diphenylsiloxane unit; however, the diphenylsiloxane units must be no more than 5 mole % of the total siloxane units in the composition under consideration because this provides the cured product generated by the hydrosilylation reaction between components (A) and (B) with a high optical transmittance and a high resistance to discoloration.

As a consequence, the diphenylsiloxane unit content in the total siloxane units in component (A) must satisfy the aforementioned requirement, and the diphenylsiloxane unit content in the total siloxane units in component (A) is therefore no more than 5 mole % and preferably no more than 3 mole % and more preferably the diphenylsiloxane unit is not present.

When component (A) has a straight chain molecular structure, the silicon-bonded phenyl group is present only at both terminals, or both in side chain position and at both terminals, or only in side chain position. When component (A) has a branched molecular structure, the silicon-bonded phenyl group is present, for example, only in terminal position, or both in side chain position and at both terminals, or only in side chain position, or at branch points. Ordinarily only one phenyl group is bonded at a single silicon atom.

The molecular structure of component (A) can be exemplified by straight chain, branched, cyclic, and structures that combine the preceding. Branched refers not only to a purely branched configuration, but also to branched straight-chain configurations, network configurations, cage configurations, and three-dimensional configurations. Component (A) may also be an organopolysiloxane mixture that contains a plurality of these structures.

Component (A) is preferably a liquid at ambient temperature, typically at 25° C. based on a consideration of the molding processability of the curable organopolysiloxane composition of the present invention. While there is no limitation on the viscosity of component (A), component (A) preferably has a viscosity at 25° C. in the range of 10 to 1,000,000 mPa·s and more preferably in the range of 100 to 50,000 mPa·s. The reasons for this are as follows: the mechanical strength of the resulting cured product declines when the viscosity of component (A) is less than the lower limit on the above range, while the handling characteristics of the resulting composition deteriorate when the upper limit on the above range is exceeded.

Component (A) is preferably represented by average unit formula (1):

$$R_aSiO_{(4-a)/2} \qquad (1)$$

wherein R is $C_2$ to $C_8$ alkenyl, methyl, and phenyl, at least 20 mole % thereof is comprised of phenyl groups, and a is a positive number from 0.5 to 2.2. The $C_2$ to $C_8$ alkenyl group encompassed by R is exemplified here by vinyl, allyl, butenyl, pentenyl, and hexenyl, with vinyl being preferred from the standpoints of the ease of component (A) production and the hydrosilylation reactivity.

Based on a consideration of the curability of the hydrosilylation reaction-curable organopolysiloxane composition of the present invention and the optical semiconductor element sealant of the present invention and the properties of the cured product therefrom, component (A) is preferably a mixture of
(A1) a methylphenylalkenylpolysiloxane represented by average unit formula (2):

$$R_dSiO_{(4-d)/2} \qquad (2)$$

wherein R is $C_2$ to $C_8$ alkenyl, methyl, and phenyl, at least 20 mole % thereof is comprised of phenyl groups, and d is a positive number from 1.9 to 2.2 that has at least two silicon-bonded $C_2$ to $C_8$ alkenyl groups per molecule, is liquid at ambient temperature and has a viscosity at 25° C. of 10 to 100,000 mPa·s, with the proviso that diphenylsiloxane units are no more than 5 mole % of the total siloxane units therein, and
(A2) an organopolysiloxane resin represented by average unit formula (3):

$$R_eSiO_{(4-e)/2} \qquad (3)$$

wherein R is $C_2$ to $C_8$ alkenyl, methyl, and phenyl, at least 20 mole % thereof is comprised of phenyl groups, and e is a positive number from 0.5 to 1.7 that is a solid at ambient temperature and has at least two silicon-bonded alkenyl groups per molecule, with the proviso that diphenylsiloxane units are no more than 5 mole % of the total siloxane units therein,
wherein component (A1) is 99 to 30 weight % of the mixture and component (A2) is 1 to 70 weight % of the mixture and their total is 100 weight %.

Component (A1) is a liquid at ambient temperature, typically at 25° C. Since d in average unit formula (2) has an average value of 1.9 to 2.2, component (A1) has a straight chain molecular structure or a moderately branched straight chain molecular structure and particularly preferably is a straight chain methylphenylalkenylpolysiloxane with average structural formula (4):

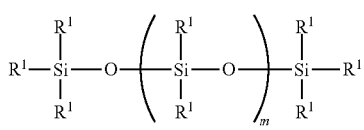

wherein $R^1$ is $C_2$ to $C_8$ alkenyl, methyl, and phenyl, at least 20 mole % thereof is comprised of phenyl groups, and m is a number that provides a viscosity at 25° C. of 10 to 100,000 mPa·s.

$R^1$ in the preceding average structural formula is $C_2$ to $C_8$ alkenyl, methyl, and phenyl. At least 20 mole % of the $R^1$ groups in the molecule is comprised of phenyl groups because this provides the cured product from the composition of the present invention with a low light attenuation due to refraction, reflection, scattering, and so forth, while preferably at least 30 mole % and particularly preferably at least 40 mole % of the $R^1$ groups in the molecule is comprised of phenyl groups. However, an overly large phenyl content results in a decline in transparency due to turbidity in the composition and the phenyl content is therefore preferably no more than 80 mole %. The diphenylsiloxane units are no more than 5 mole % of the total siloxane units in this component based on a consideration of the resistance to discoloration by the cured product from the curable organopolysiloxane composition of the present invention and the optical semiconductor element sealant of the present invention, and preferably is no more than 3 mole % and most preferably is 0 mole %.

The straight chain methylphenylalkenylpolysiloxane with the average structural formula given above can be exemplified by the following: dimethylvinylsiloxy-endblocked methylphenylpolysiloxane, methylphenylvinylsiloxy-endblocked methylphenylpolysiloxane, methyldivinylsiloxy-endblocked methylphenylpolysiloxane, dimethylvinylsiloxy-endblocked dimethylsiloxane·methylphenylsiloxane copolymer, trimethylsiloxy-endblocked methylvinylsiloxane·methylphenylsiloxane copolymer, trimethylsiloxy-endblocked dimethylsiloxane·methylvinylsiloxane·methylphenylsiloxane copolymer, dimethylphenylsiloxy-endblocked methylvinylsiloxane·methylphenylsiloxane copolymer, dimethylhexenylsiloxy-endblocked methylphenylpolysiloxane, and trimethylsiloxy-endblocked methylhexenylsiloxane·methylphenylsiloxane copolymer.

Because e in average unit formula (3) has an average value of 0.5 to 1.7, component (A2) has a branched, network, cage, or three dimensional molecular structure or has a molecular structure that is some combination of the preceding. Component (A2) is a solid at ambient temperature, typically at 25° C.

The siloxane units that may constitute the organopolysiloxane resin with average unit formula (3) are a triorganosiloxane unit (abbreviated as M unit), a diorganosiloxane unit (abbreviated as D unit), a monoorganosiloxane unit (abbreviated as T unit), and $SiO_{4/2}$ unit (abbreviated as Q unit).

The T unit, Q unit, or T unit and Q unit are essential for the organopolysiloxane resin with average unit formula (3), while the presence of the D unit is preferred in order to lower the softening point of this organopolysiloxane resin.

The following are preferred siloxane unit compositions: T units and D units; T units and M units; T units and D units and M units; T units and D units and Q units; T units and D units and Q units and M units; and D units and Q units and M units.

The monoorganosiloxane unit can be represented by $RSiO_{3/2}$ unit and can be exemplified by $MeSiO_{3/2}$ unit, $PhSiO_{3/2}$ unit, and $ViSiO_{3/2}$ unit.

The diorganosiloxane unit can be represented by $R_2SiO_{2/2}$ unit and can be exemplified by $MePhSiO_{2/2}$ unit, $Me_2SiO_{2/2}$ unit, $MeViSiO_{2/2}$ unit, and $Ph_2SiO_{2/2}$ unit.

The triorganosiloxane unit can be represented by $R_3SiO_{1/2}$ unit and can be exemplified by $Me_3SiO_{1/2}$ unit, $Me_2PhSiO_{1/2}$ unit, $MeViPhSiO_{1/2}$ unit, and $MeVi_2SiO_{1/2}$ unit. Here, Me denotes methyl group; Vi denotes vinyl group; and Ph denotes phenyl group.

The preceding siloxane units can include siloxane units generated by the substitution of a portion of the R groups by OH group, for example, a $R(HO)SiO_{2/2}$ unit, $R_2(HO)SiO_{1/2}$ unit, and $(HO)SiO_{3/2}$ unit.

The phenyl group is at least 20 mole % and preferably at least 30 mole % and particularly preferably at least 40 mole % of the silicon-bonded $C_2$ to $C_8$ alkenyl, methyl, and phenyl in the methylphenylalkenylpolysiloxane comprising the siloxane units described above. However, an overly large phenyl content results in a decline in transparency due to turbidity in the composition and the phenyl content is therefore preferably no more than 80 mole %.

The diphenylsiloxane units are no more than 5 mole % of the total siloxane units based on a consideration of the resistance to discoloration exhibited by the cured product, while no more than 3 mole % is preferred and 0 mole % is most preferred. In the present invention, the diphenylsiloxane unit includes $XPh_2SiO_{1/2}$ unit wherein X is $C_2$ to $C_8$ alkenyl or methyl and Ph denotes phenyl group, for example, methyldiphenylsiloxane unit, vinyldiphenylsiloxane unit, and so forth.

The total content of 1,3,5-trimethyl-1,3,5-triphenylcyclotrisiloxane and 1,3,5,7-tetramethyl-1,3,5,7-tetraphenylcyclotetrasiloxane in the curable organopolysiloxane composition of the present invention and the optical semiconductor element sealant of the present invention is preferably no more than 5 weight %. These cyclics are frequently present in component (A) as by-products, and the total content of 1,3,5-trimethyl-1,3,5-triphenylcyclotrisiloxane and 1,3,5,7-tetramethyl-1,3,5,7-tetraphenylcyclotetrasiloxane in component (A) is therefore preferably no more than 5 weight % and more preferably is no more than 3 weight %, while the absence of these cyclics is most preferred.

The content of these cyclics can be determined by a quantitative analysis by headspace gas chromatography using n-undecane as an internal standard. Thus, the relative intensity of 1,3,5-trimethyl-1,3,5-triphenylcyclotrisiloxane and 1,3,5,7-tetramethyl-1,3,5,7-tetraphenylcyclotetrasiloxane with respect to n-undecane is measured in advance using a reference sample and the 1,3,5-trimethyl-1,3,5-triphenylcyclotrisiloxane and 1,3,5,7-tetramethyl-1,3,5,7-tetraphenylcyclotetrasiloxane are determined from the peak intensity on the gas chromatogram and the quantity of n-undecane addition to the sample (this also applies below).

Component (A) can be produced by synthesis by the usual equilibration polymerization reaction or cohydrolysis and condensation reaction and removal of volatile fractions. For example, production can be carried out by implementing an equilibration polymerization by heating a cyclic methylphenylsiloxane oligomer in the presence of a molecular chain endblocking agent, e.g., 1,3-divinyltetramethyldisiloxane or 1,3-divinyl-1,3-diphenyldimethyldisiloxane, and a polymerization catalyst, e.g., potassium hydroxide, potassium dimethylsiloxanolate, tetramethylammonium hydroxide, or tetramethylammonium dimethylsiloxanolate; neutralizing or thermally degrading the polymerization catalyst; and then removing the 1,3,5-trimethyl-1,3,5-triphenylcyclotrisiloxane and 1,3,5,7-tetramethyl-1,3,5,7-tetraphenylcyclotetrasiloxane by heating under a reduced pressure.

Component (B) is a methylphenylhydrogenpolysiloxane that has at least two silicon-bonded hydrogen atoms per molecule, wherein the diphenylsiloxane units are no more than 5 mole % of the total siloxane units and the phenyl group is at least 20 mole % of the total silicon-bonded organic groups in the molecule, and preferably has average unit formula (5):

$$R^2{}_b H_c SiO_{(4-b-c)/2} \quad\quad\quad (5)$$

wherein $R^2$ is methyl and phenyl, at least 20 mole % thereof is comprised of phenyl groups, b is a positive number from 1.0 to 2.2, and c is a positive number from 0.002 to 1.0.

At least two silicon-bonded hydrogen atoms must be present in each molecule since curing proceeds under a hydrosilylation reaction between component (B) and component (A), while the presence of at least three is preferred. When component (B) has a straight chain molecular structure, the silicon-bonded hydrogen atom is present only at both terminals, or both in side chain position and at both terminals, or only in side chain position. When component (B) has a cyclic molecular structure, the silicon-bonded hydrogen atom is present only in side chain position. When component (B) has a branched molecular structure, the silicon-bonded hydrogen atom is present, for example, only in terminal position, or only in side chain position, or at branch points, or in both terminal and side chain position. Ordinarily only one hydrogen atom is bonded to a single silicon atom, but two hydrogen atoms may be bonded to a single silicon atom.

The silicon-bonded phenyl group in component (B) provides a cured product generated by the hydrosilylation reaction between components (A) and (B) with a low light attenuation due to refraction, reflection, scattering, and so forth, and for this reason the content of silicon-bonded phenyl group in component (B), considered with respect to the total silicon-bonded organic groups in component (B), is at least 20 mole % and preferably is at least 30 mole % and particularly preferably is at least 40 mole %. However, an overly large phenyl content results in a decline in transparency due to turbidity in the composition and the phenyl content is therefore preferably no more than 80 mole %.

The silicon-bonded phenyl group in component (B) can be present in the form of the diphenylsiloxane unit; however, the diphenylsiloxane units must be no more than 5 mole % of the total siloxane units in the composition according to the present invention because this provides the cured product generated by the hydrosilylation reaction between components (A) and (B) with a high optical transmittance and a high resistance to discoloration, and the diphenylsiloxane unit content in the total siloxane units in component (B) must also satisfy this requirement. As a consequence, the diphenylsiloxane unit content in the total siloxane units in component (B) is no more than 5 mole % and preferably no more than 3 mole % and most preferably the diphenylsiloxane unit is not present.

When component (B) has a straight chain molecular structure, the silicon-bonded phenyl group is present only at both terminals, or both in side chain position and at both terminals, or only in side chain position. When component (B) has a branched molecular structure, the silicon-bonded phenyl group is present, for example, only in terminal position, or both in side chain position and at both terminals, or only in side chain position, or at branch points. Ordinarily only one phenyl group is bonded at a single silicon atom.

The molecular structure of component (B) can be exemplified by straight chain, branched, cyclic, and structures that combine the preceding. Branched refers not only to a purely branched configuration, but also to branched straight-chain configurations, network configurations, cage configurations, and three-dimensional configurations.

Component (B) is preferably a liquid at ambient temperature, typically at 25° C., and, while there is no limitation on its viscosity, the range of 1 to 10,000 mPa·s at 25° C. is preferred and the range of 2 to 5,000 mPa·s at 25° C. is particularly preferred. The reasons for this are as follows: when component (B) has a viscosity below the lower limit on the preceding range, it will readily volatilize during mixing with other components or during storage, creating the risk that the composition of the curable organopolysiloxane composition will be unstable; on the other hand, it is difficult to produce an organohydrogenpolysiloxane that exceeds the upper limit on the preceding range.

A representative example of the straight chain implementation of component (B) is the straight chain methylphenylhydrogenpolysiloxane with average structural formula (2):

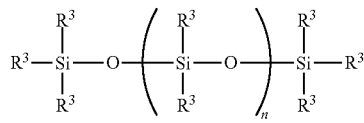

wherein $R^3$ is methyl, phenyl, and the hydrogen atom, the phenyl group is at least 20 mole % of the total number of methyl plus phenyl groups, at least two of the total $R^3$ groups in the molecule are hydrogen atoms, and n is a number that provides a viscosity at 25° C. in the range of 1 to 10,000 mPa·s.

The phenyl group is preferably at least 30 mole % and more preferably at least 40 mole % of total number of methyl plus phenyl groups because this provides the cured product from the composition according to the present invention with a low light attenuation due to refraction, reflection, scattering, and so forth.

A too high phenyl group content, however, reduces the transparency due to turbidity in the composition, and the phenyl group content is thus preferably no greater than 80 mole%.

When component (A) has two alkenyl groups per molecule, at least three of the total $R^3$ groups in the molecule are then preferably hydrogen atoms. Component (B) has a viscosity at 25° C. of 1 to 10,000 mPa·s and preferably 2 to 5,000 mPa·s. n in average structural formula (2) is a number greater than or equal to 0 and preferably is a number greater than or equal to 1.

Preferred specific examples of the straight chain organohydrogenpolysiloxane with average structural formula (2) are straight chain methylphenylhydrogenpolysiloxanes in which the main chain is a straight chain methylphenylpolysiloxane, straight chain methylhydrogensiloxane—methylphenylsiloxane copolymer, or straight chain methylhydrogensiloxane—diphenylsiloxane copolymer, and the two terminals are dimethylhydrogensiloxy groups, methylphenylhydrogensiloxy groups, trimethylsiloxy groups, or dimethylphenylsiloxy groups. Here, the polysiloxane includes oligomeric siloxanes.

The following are representative examples of the branched configuration of component (B): a branched methylphenylhydrogenpolysiloxane with average siloxane unit formula (4):

$$(C_6H_5SiO_{3/2})_x(HMe_2SiO_{1/2})_y \qquad (4)$$

wherein $C_6H_5$ is phenyl group, Me is methyl group, x is 0.3 to 0.75, y is 0.25 to 0.7, and x+y=1.0; and a branched methylphenylhydrogenpolysiloxane with the following average siloxane unit formula:

$$(C_6H_5SiO_{3/2})_x(MeSiO_{3/2})_y(HMe_2SiO_{1/2})_z$$

wherein $C_6H_5$ is phenyl group, Me is methyl group, x is 0.3 to 0.7, y is 0 to 0.3, z is 0.25 to 0.7, and x +y +z =1.0. Here, the polysiloxane includes oligomeric siloxanes.

The following are specific examples of component (B): methylphenylhydrogensiloxane oligomers represented by $(HMePhSi)_2O$, $(HMe_2SiO)_2SiMePh$, $(HMe_2SiO)_3SiPh$, and $(HMePhSiO)_3SiPh$; a branched methylphenylhydrogenpolysiloxane comprising $(PhSiO_{3/2})$ units and $(Me_2HSiO_{1/2})$ units; a branched methylphenylhydrogenpolysiloxane comprising $(PhSiO_{3/2})$ units, $(Me_2SiO_{2/2})$ units, and $(Me_2HSiO_{1/2})$ units; a branched methylphenylhydrogenpolysiloxane comprising $(PhSiO_{3/2})$ units, $(MePhSiO_{2/2})$ units, and $(Me_2HSiO_{1/2})$ units; a branched methylphenylhydrogenpolysiloxane comprising $(PhSiO_{3/2})$ units, $(MeSiO_{3/2})$ units, and $(Me_2HSiO_{1/2})$ units; and a branched methylphenylhydrogenpolysiloxane comprising $(PhSiO_{3/2})$ units and $(MeHSiO_{2/2})$ units. Ph denotes phenyl and Me denotes methyl in the preceding formulas.

Here, the branched configuration encompasses network configurations, cage configurations, and three-dimensional configurations. All of these are preferably a liquid at ambient temperature, typically at 25° C.

Component (B) is produced by the usual cohydrolysis and condensation reaction or equilibration polymerization reaction. Two or more component (B)'s that differ, for example, in their substituent groups, constituent siloxane units, degrees of polymerization, viscosity, and so forth, may be used in combination.

Component (B) has a total content of 1,3,5-trimethyl-1,3,5-triphenylcyclotrisiloxane and 1,3,5,7-tetramethyl-1,3,5,7-tetraphenylcyclotetrasiloxane preferably of no more than 5 weight %, more preferably no more than 3 weight %, and most preferably zero.

Component (B) is incorporated in an amount that provides 10 to 500% for the total number of moles of silicon-bonded hydrogen atoms in component (B) relative to the total number of moles of alkenyl groups in component (A), i.e., [total number of moles of silicon-bonded hydrogen atoms in component (B)]/[total number of moles of alkenyl groups in component (A)]=0.1 to 5.0. The amount of component (B) incorporation provides preferably 50 to 200% and more preferably 70 to 150% for the total number of moles of silicon-bonded hydrogen atoms in component (B) relative to the total number of moles of alkenyl groups in component (A). The reasons for this are follows: when the amount of component (B) incorporation is less than the lower limit for the aforementioned range, curing of the resulting composition tends to be unsatisfactory; on the other hand, when the upper limit for the aforementioned range is exceeded, the resulting cured product takes on a high modulus and its heat resistance tends to decline.

The hydrosilylation reaction catalyst that is component (C) is a catalyst that promotes the hydrosilylation reaction between the alkenyl group in component (A) and the silicon-bonded hydrogen atom in component (B). This component (C) is preferably a catalyst in the form of a platinum group element or a compound of a platinum group element and can be exemplified by platinum-based catalysts, rhodium-based catalysts, and palladium-based catalysts. Platinum-based catalysts are preferred because they significantly promote the hydrosilylation reaction between components (A) and (B) and thus significantly promote curing of the composition under consideration.

These platinum-based catalysts can be exemplified by finely divided platinum, platinum black, chloroplatinic acid, alcohol modifications of chloroplatinic acid, chloroplatinic acid/diolefin complexes, platinum/olefin complexes, platinum-carbonyl complexes such as platinum bis(acetoacetate) and platinum bis(acetylacetonate), chloroplatinic acid/alkenylsiloxane complexes such as chloroplatinic acid/divinyltetramethyldisiloxane complexes and chloroplatinic acid/tetravinyltetramethylcyclotetrasiloxane complexes, platinum/alkenylsiloxane complexes such as platinum/divinyltetramethyldisiloxane complexes and platinum/tetravinyltetramethylcyclotetrasiloxane complexes, and complexes between chloroplatinic acid and acetylene alcohols. Platinum/alkenylsiloxane complexes are particularly preferred from the standpoint of the hydrosilylation reaction performance.

The alkenylsiloxane for the platinum/alkenylsiloxane complexes can be exemplified by 1,3-divinyl-1,1,3,3-tetramethyldisiloxane, 1,3,5,7-tetramethyl-1,3,5,7-tetravinylcyclotetrasiloxane, alkenylsiloxanes afforded by replacing a portion of the methyl in the preceding alkenylsiloxanes with, for example, ethyl, phenyl, and so forth, and alkenylsiloxanes afforded by replacing the vinyl in the preceding alkenylsiloxanes with, for example, allyl or hexenyl. 1,3-divinyl-1,1,3,3-tetramethyldisiloxane is particularly preferred because it produces a platinum/alkenylsiloxane complex that has an excellent stability.

In addition, in order to improve the stability of these platinum/alkenylsiloxane complexes, these complexes are preferably blended with an organosiloxane oligomer such as a dimethylsiloxane oligomer or an alkenylsiloxane oligomer such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, 1,3,5,7-tetramethyl-1,3,5,7-tetravinylcyclotetrasiloxane, and so forth, wherein blending with an alkenylsiloxane oligomer is particularly preferred.

Component (C) is incorporated in an amount that can cure the composition of the present invention, but its amount of incorporation is not otherwise limited. In specific terms, component (C) is incorporated in an amount that provides preferably 0.01 to 500 weight-ppm, more preferably 0.01 to 100 weight-ppm, and particularly preferably 0.1 to 50 weight-ppm metal atoms in this component with reference to the composition of the present invention. The reasons for this are as follows: when the amount of component (C) incorporation is less than the lower limit on the aforementioned range, the cure of the composition of the present invention tends to be unsatisfactory; on the other hand, exceeding the upper limit on the aforementioned range runs the risk of causing problems such as discoloration of the resulting cured product.

The diphenylsiloxane units must be no more than 5 mole %—and is preferably no more than 3 mole %—of the total siloxane units in the inventive hydrosilylation reaction-curable organopolysiloxane composition comprising components (A) to (C) and the inventive optical semiconductor element sealant because this provides a high optical transmittance and high resistance to discoloration for the cured product from the hydrosilylation reaction-curable organopolysiloxane composition of the present invention and the optical semiconductor element sealant of the present invention. The reason for this is as follows: unlike other phenyl-substituted siloxane units, the diphenylsiloxane unit exhibits light absorption at 300 to 400 nm, and when the inventive curable organopolysiloxane composition or the inventive optical semiconductor element sealant contains more than 5 mole % diphenylsiloxane unit, the cured product therefrom exhibits a diminished optical transmittance at 300 to 400 nm and readily undergoes discoloration.

In order to improve the storage stability and extend the pot life at ambient temperature, a hydrosilylation reaction inhibitor (D) is preferably incorporated in the curable organopolysiloxane composition of the present invention and the optical semiconductor element sealant of the present invention. This hydrosilylation reaction inhibitor can be exemplified by alkyne alcohols such as 2-methyl-3-butyn-2-ol, 3,5-dimethyl-1-hexyn-3-ol, 2-phenyl-3-butyn-2-ol, and so forth; eneyne compounds such as 3-methyl-3-penten-1-yne, 3,5-dimethyl-3-hexen-1-yne, and so forth; methylalkenylsiloxane oligomers such as 1,3,5,7-tetramethyl-1,3,5,7-tetravinylcyclotetrasiloxane, 1,3,5,7-tetramethyl-1,3,5,7-tetrahexenylcyclotetrasiloxane, and so forth; alkyneoxysilanes such as dimethylbis(3-methyl-1-butyn-3-oxy)silane, methylvinylbis(3-methyl-1-butyn-3-oxy)silane, and so forth; and benzotriazole.

This hydrosilylation reaction inhibitor (D) is incorporated in an amount sufficient to inhibit gelation or curing when component (C) is mixed with components (A) and (B) and in an amount sufficient to provide long-term storability. It is incorporated preferably at 0.0001 to 5 weight parts and more preferably 0.01 to 3 weight parts, in each case per 100 weight parts of the total of components (A) and (B).

An agent (E) that imparts or promotes adhesion (referred to hereafter as an adhesion promoter) can be incorporated in the curable organopolysiloxane composition of the present invention and the optical semiconductor element sealant of the present invention in order to provide additional improvement in the adhesiveness to substrate in contact with the composition or sealant during the cure of the composition or sealant. The adhesion promoter (E) for this purpose is preferably a highly discoloration-resistant adhesion promoter selected from organosilicon compound-type adhesion promoters known for use in hydrosilylation reaction- curable organopolysiloxane compositions.

Typical examples are organosilanes and straight-chain, branched, or cyclic organosiloxane oligomers having approximately 4 to 20 silicon atoms, in each case having a trialkoxysiloxy group (e.g., trimethoxysiloxy, triethoxysiloxy) or trialkoxysilylalkyl group (e.g., trimethoxysilylethyl, triethoxysilylethyl) and a functional group selected from the group consisting of the "hydrosilyl group, silicon-bonded alkenyl (e.g., vinyl, allyl), silicon-bonded methacryloxyalkyl (e.g., 3-methacryloxypropyl), and silicon-bonded epoxy-functional alkyl (e.g., 3-glycidoxypropyl, 4-glycidoxybutyl, 2-(3,4-epoxycyclohexyl)ethyl, 3-(3,4-epoxycyclohexyl)propyl)". Other typical examples are epoxy-functional ethylpolysilicates and the products of the reaction of an aminoalkyltrialkoxysilane with an epoxy-functional alkyltrialkoxysilane.

Specific examples are as follows: vinyltrimethoxysilane, allyltrimethoxysilane, allyltriethoxysilane, hydrogentriethoxysilane, 3-glycidoxypropyltrimethoxysilane, 3-glycidoxypropyltriethoxysilane, 2-(3,4-epoxycyclohexyl)ethyltrimethoxysilane, 3-methacryloxypropyltrimethoxysilane, 3-methacryloxypropyltriethoxysilane, the reaction product of 3-glycidoxypropyltriethoxysilane with 3-aminopropyltriethoxysilane, the condensation reaction product of a silanol-endblocked methylvinylsiloxane oligomer with 3-glycidoxypropyltrimethoxysilane, the condensation reaction product of a silanol-endblocked methylvinylsiloxane oligomer with 3-methacryloxypropyltriethoxysilane, and tris(3-trimethoxysilylpropyl)isocyanurate.

This adhesion promoter preferably does not contain an active nitrogen atom, e.g., the amino group, from the standpoint of preventing a decline in the optical transmittance and maintaining a resistance to yellowing when the cured product is subjected to long-term use under heating.

This adhesion promoter is preferably a low-viscosity liquid at ambient temperature and its viscosity preferably is in the range from 1 to 500 mPa·s at 25° C.

This adhesion promoter is incorporated in the composition under consideration in an amount that does not impair the curing characteristics or the properties of the cured product, but its quantity of incorporation is not otherwise limited. However, it is incorporated preferably at from 0.01 to 10 weight parts and more preferably at from 0.1 to 5 weight parts, in each case per 100 weight parts of the total of components (A) and (B).

The hydrosilylation reaction-curable organopolysiloxane composition of the present invention may incorporate the following as additional optional components insofar as the objects of the present invention are not impaired: inorganic fillers such as silica, glass, alumina, zinc oxide, and so forth; silicone rubber powder; silicone resin powder; finely divided powders of organic resins such as polymethacrylate resin and so forth; heat stabilizers; dyes; pigments; flame retardants; solvents; and so forth.

However, the essential components and optional components must be selected and incorporated such that the diphenylsiloxane units is are no more than 5 mole % and preferably is no more than 3 mole % of the total siloxane units in the curable organopolysiloxane composition and the optical semiconductor element sealant, and even more preferably is not present.

In addition, the essential components and optional components must be selected and incorporated such that the total content of 1,3,5-trimethyl-1,3,5-triphenylcyclotrisiloxane and 1,3,5,7-tetramethyl-1,3,5,7-tetraphenylcyclotetrasiloxane does not exceed 5 weight % and preferably does not exceed 3 weight % and more preferably is zero.

Based on a consideration of the moldability, the curable organopolysiloxane composition of the present invention are preferably liquids at ambient temperature, typically at 25° C. and have a viscosity at 25° C. in the range of 10 to 1,000,000 mPa·s and particularly preferably in the range of 100 to 50,000 mPa·s.

The curable organopolysiloxane composition of the present invention can be prepared by mixing components (A) to (C) or components (A) to (C) plus optional components to uniformity.

The hydrosilylation reaction-curable organopolysiloxane composition of the present invention, because it is based on the previously described components (A) and (B), provides a cured product that necessarily has a large refractive index at 25° C. for visible light at 589 nm as well as a high optical transmittance both initially and after long-term holding under heating. This cured product preferably has a refractive index at 25° C. for visible light at 589 nm of at least 1.5 and preferably has an optical transmittance at 25° C. of at least 99% at a wavelength of 450 nm and an optical path length of 0.2 cm.

This cured product preferably has an optical transmittance of at least 98% at 25° C. at an optical path length of 0.2 cm and a wavelength of 450 nm after the cured product has been held for 1000 hours in a 150° C. convection oven.

The reason for the preceding is that there is a risk that a satisfactory reliability cannot be imparted to the optical semiconductor device when the optical semiconductor element is sealed with by a cured product that has a refractive index less than 1.5, and/or that has an initial optical transmittance less than 99%, and/or that has an optical transmittance, measured at 25° C. after holding for 1000 hours in a 150° C. convection oven, of less than 98%.

The optical semiconductor element sealant of the present invention comprises the hydrosilylation reaction-curable organopolysiloxane composition according to claim 6, and preferably according to claim 7. The aforementioned formulation, components, properties, preparation method and so on for the hydrosilylation reaction-curable organopolysiloxane composition of the present invention are applicable in principle to the optical semiconductor element sealant of the present invention.

The optical semiconductor element sealant, specifically encapsulant of the present invention forms a cured product that has an optical transmittance of at least 99% in a quartz cell at a wavelength of 450 nm and an optical path length of 0.2 cm and that has a refractive index at 25° C. for visible light at 589 nm of at least 1.5.

Its cured product preferably has an optical transmittance of at least 98% at 25° C. at an optical path length of 0.2 cm and a wavelength of 450 nrn after the cured product has been held for 1000 hours in a 150° C. convection oven.

The reason for the preceding is that there is a risk that a satisfactory reliability cannot be imparted to the optical semiconductor device when the optical semiconductor element is sealed with by a cured product that has a refractive index less than 1.5, and/or that has an initial optical transmittance less than 99%, and/or that has an optical transmittance, measured at 25° C. after holding for 1000 hours in a 150° C. convection oven, of less than 98%.

This refractive index can be measured, for example, using an Abbe refractometer. In this case the refractive index can be measured at any desired wavelength by changing the wavelength of the light source in the Abbe refractometer. The optical transmittance under consideration can be determined, for example, by measuring the optical transmittance at 25° C. of the cured product at a wavelength of 450 nm and an optical path length of 0.2 cm using a spectrophotometer.

The hydrosilylation reaction-curable organopolysiloxane composition of the present invention and the optical semiconductor element sealant of the present invention can be cured by standing at room temperature or by the application of heat, but the application of heat is preferred in order to bring about rapid curing. The heating temperature here is preferably in the range from 50 to 200°C.

The hydrosilylation reaction-curable organopolysiloxane composition of the present invention and the optical semiconductor element sealant of the present invention, because they form a cured product that exhibits a high refractive index, a high optical transmittance, a high resistance to discoloration, and a highly durable adhesion to subsrate, are useful, as adhesives, potting agents, encapsulants, protective coating agents, and underfills for electrical and electronic applications. In particular, the high refractive index and high optical transmittance make the curable organopolysiloxane composition of the well suited as sealants—including potting agents, encapsulants, protective coating agents, and underfills—for optical semiconductor elements and optical semiconductor devices and as adhesives—including die bonding agents—for optical semiconductor elements and optical semiconductors device.

The hydrosilylation reaction-curable organopolysiloxane composition of the present invention that has a total content of 1,3,5-trimethyl-1,3,5-triphenylcyclotrisiloxane and 1,3,5,7-tetramethyl-1,3,5,7-tetraphenylcyclotetrasiloxane of no more than 5 weight % and the optical semiconductor element sealant of the present invention that has a total content of 1,3,5-trimethyl-1,3,5-triphenylcyclotrisiloxane and 1,3,5,7-tetramethyl-1,3,5,7-tetraphenylcyclotetrasiloxane of no more than 5 weight % exhibit, even in the absence of an adhesion promoter, an excellent initial adhesion and an excellent durability of adhesion —and in particular an excellent durability of adhesion with respect to hot/cold cycling —for metals such as steel, stainless steel, aluminum, copper, silver, titanium, titanium alloys, and so forth; semiconductor elements such as silicon semiconductors, gallium-phosphorus semiconductors, gallium-arsenic semiconductors, gallium nitride semiconductors, and so forth; ceramics; glasses; thermosetting resins; and polar group-containing thermoplastic resins, and are thus useful as adhesives, potting agents, encapsulants, protective coating agents, underfills, and so forth, for electronic and electrical applications.

In particular, their high refractive index and high optical transmittance make them well suited as sealants—including potting agents, encapsulants, protective coating agents, and underfills—for optical semiconductor elements and optical semiconductor devices and as adhesives—including die bonding agents—for optical semiconductor elements and optical semiconductor devices.

The optical semiconductor device of the present invention will now be described in detail. The optical semiconductor device of the present invention is characterized in that an optical semiconductor element therein—and particularly an optical semiconductor element within a housing—is sealed, specifically encapsulated with a cured product from the previously described optical semiconductor element sealant, specifically encapsulant. This optical semiconductor element can be specifically exemplified by light-emitting diode (LED) elements, semiconductor laser elements, organic EL's, photodiode elements, phototransistor elements, solid-state imaging elements, and light-receiving elements and light-emitting elements for photocouplers.

The optical semiconductor element is preferably a light-emitting diode (LED) element in view of the high refractive index and high optical transmittance of the cured product from the hereinabove-described curable organopolysiloxane composition.

The housing here is preferably made of a material to which the curable organopolysiloxane composition of the present invention and the optical semiconductor element sealant of the present invention will readily adhere, e.g., metal, ceramic, thermosetting resin, or polar group-containing thermoplastic resin, and there are no limitations on its shape and construction.

The metal can be exemplified by stainless steel, aluminum, and duralumin; the thermosetting resin can be exemplified by epoxy resins, phenolic resins, and unsaturated polyester resins; and the polar group-containing thermoplastic resin can be exemplified by polyphthalamide resin, polybutylene terephthalate resin, ABS resin, and liquid-crystal polymers.

The optical semiconductor element sealant, specifically encapsulant of the present invention is preferably cured while in contact with both the optical semiconductor element within the housing and the electrically isolating housing inner wall.

The refractive index at 25° C. for visible light at 589 nm and the optical transmittance at 25° C. of the cured product from the optical semiconductor element sealant, specifically encapsulant are the same as previously described.

The optical semiconductor device of the present invention can be exemplified by light-emitting diode (LED) devices, photocouplers, CCD devices, semiconductor laser devices, optical detectors, optical waveguides, optical waveguide modulators, and optical integrated circuits.

In particular, the optical semiconductor device of the present invention is preferably a light-emitting diode (LED) device in view of the high optical transmittance.

FIG. 1 is a cross-sectional drawing of a standalone surface mount-type light-emitting diode (LED) device that is a representative example of the optical semiconductor device of the present invention. In the light-emitting diode (LED) device shown in FIG. 1, a light-emitting diode (LED) chip 2 is die bonded on a die pad 6 within a polyphthalamide (PPA) resin housing 1, and this light-emitting diode (LED) chip 2 is wire-bonded to an inner lead 3 by a bonding wire 4. This light-emitting diode (LED) chip 2 is sealed, specifically encapsulated along with the inner wall of the housing 1 by a cured product 5 from the optical semiconductor element sealant, specifically encapsulant of the present invention.

To produce the surface mount-type light-emitting diode (LED) device shown in FIG. 1, the light-emitting diode (LED) chip 2 is die bonded on the die pad 6 within the polyphthalamide (PPA) resin housing 1 and the light-emitting diode (LED) chip 2 is wire-bonded to the inner lead 3 by a gold bonding wire 4. The optical semiconductor element sealant, specifically encapsulant of the present invention is then introduced into the housing 1; degassing is thereafter preferably performed; and curing is then brought about by heating to 50 to 200° C.

EXAMPLES

The hydrosilylation reaction-curable organopolysiloxane composition, optical semiconductor element sealant, specifically encapsulant, and optical semiconductor device of the present invention will be described in detail through Examples and Comparative Examples. The viscosity in the Examples and Comparative Examples is the value measured at 25° C. In Examples and Comparative Examples, Me refers to the methyl group; Ph refers to the phenyl group; and Vi refers to the vinyl group.

The properties of the hydrosilylation reaction-curable organopolysiloxane compositions, the optical semiconductor element sealants, specifically encapsulant, and the cured products therefrom were measured as reported below, and the results are given in Table 1.

Surface mount-type light-emitting diode (LED) devices were fabricated using the optical semiconductor element sealants, specifically encapsulant, and the detachment rate of the cured products was evaluated as reported below and is given in Table 2. While the curable organopolysiloxane composition also denotes the optical semiconductor element sealant, specifically encapsulant in the examples and comparative examples, the former has been indicated simply with "curable organopolysiloxane composition".

[Content of 1,3,5-trimethyl-1,3,5-triphenylcyclotrisiloxane and 1,3,5,7-tetramethyl-1,3,5,7-tetraphenylcyclotetrasiloxane]

The content of 1,3,5-trimethyl-1,3,5-triphenylcyclotrisiloxane and 1,3,5,7-tetramethyl-1,3,5,7-tetraphenylcyclotetrasiloxane in the hydrosilylation reaction-curable organopolysiloxane composition was determined by quantitative analysis by headspace gas chromatography using n-undecane as the internal standard. Thus, the relative intensity of 1,3,5-trimethyl-1,3,5-triphenylcyclotrisiloxane and 1,3,5,7-tetramethyl-1,3,5,7-tetraphenylcyclotetrasiloxane with respect to n-undecane was measured in advance using a reference sample and the 1,3,5-trimethyl-1,3,5-triphenylcyclotrisiloxane and 1,3,5,7-tetramethyl-1,3,5,7-tetraphenylcyclotetrasiloxane were determined from the peak intensity on the gas chromatogram and the quantity of n-undecane addition to the sample.

The determination was carried out as follows: approximately 2 g of the sample was weighed into a special 20-mL vial; the vial was sealed; heating was performed for 3 hours× 150° C. with a G1888 headspace sampler from Agilent Technologies, Inc.; and the determination was performed with a capillary gas chromatograph from Agilent Technologies, Inc., using a DB-5 column from J & W Scientific at a column length of 30 m, a column inner diameter of 0.25 mm, and a liquid phase thickness of 0.25 μm. After holding for 5 minutes at 40° C., the column temperature was raised to 250° C. at 10° C/minute and was held there for 5 minutes. A hydrogen flame ionization detector (FID) was used as the detector.

[Refractive index of the curable organopolysiloxane composition]

The refractive index of the hydrosilylation reaction-curable organopolysiloxane composition was measured at 25° C. using an Abbe refractometer. Visible light at 589 nm was used as the light source.

[Optical transmittance of the cured product from the curable organopolysiloxane composition]

The hydrosilylation reaction-curable organopolysiloxane composition was introduced between two glass sheets and was cured by holding for 1 hour at 150° C. to provide an optical path length of 0.2 cm. The optical transmittance of the cured product was measured at 25° C. using a recording spectrophotometer capable of measurement at any wavelength in the visible range (wavelength=400 nm to 700 nm). The optical transmittance was measured on the glass sheet sandwich and on the glass sheet by itself and the difference was used as the optical transmittance of the cured product. Table 1 reports the optical transmittance at a wavelength of 450 nm.

[Optical transmittance of the cured product from the curable organopolysiloxane composition after holding for 1000 hours at 150° C.]

The sample described above, after measurement of the optical transmittance had been performed, was held for 1000 hours in a 150° C. convection oven, after which the optical transmittance was measured as described above. Table 1 reports the optical transmittance at a wavelength of 450 nm.

[Hardness of the cured product from the curable organopolysiloxane composition]

A sheet of the cured product was fabricated by press-molding the hydrosilylation reaction-curable organopolysiloxane composition for 1 hour at 150° C. The hardness of this cured product sheet was measured using the type A or type D durometer specified in JIS K-6253.

[Adhesive strength for polyphthalamide (PPA) resin plate by the cured product from the curable organopolysiloxane composition]

Polytetrafluoroethylene resin spacers (width =10 mm, length=20 mm, thickness=1 mm) were sandwiched between two polyphthalamide (PPA) resin sheets (width =25 mm, length=50 mm, thickness=1 mm); the hydrosilylation reaction-curable organopolysiloxane composition was filled into the gap; this was secured with clips; and curing was performed by holding for 1 hour in a 150° C. convection oven. After cooling to room temperature, the clips and spacers were removed; the polyphthalamide (PPA) resin plates were pulled in opposite directions along the horizontal using a tensile tester; and the stress at the time of cured product failure was measured.

[Adhesive strength for aluminum plate by the cured product from the curable organopolysiloxane composition]

Polytetrafluoroethylene resin spacers (width=10 mm, length=20 mm, thickness=1 mm) were sandwiched between two aluminum plates (width=25 mm, length=75 mm, thickness=1 mm); the curable organopolysiloxane composition was filled into the gap; this was secured with clips; and curing was performed by holding for 1 hour in a 150° C. convection oven. After cooling to room temperature, the clips and spacers were removed; the aluminum plates were pulled in opposite directions along the horizontal using a tensile tester; and the stress at the time of cured product failure was measured.

[Fabrication of surface mount-type light-emitting diode (LED) devices]

The hydrosilylation reaction-curable organopolysiloxane composition of the particular example or comparative example was degassed and introduced using a dispenser into a closed-bottom cylindrical polyphthalamide (PPA) resin housing 1 (inner diameter=2.0 mm, depth=1.0 mm) in which an inner lead 3 extended from the side wall toward the center of the interior base region of the polyphthalamide (PPA) housing 1, a light-emitting diode (LED) chip 2 was mounted on the center of the inner lead 3, and the light-emitting diode (LED) chip 2 and inner lead 3 were electrically connected by a bonding wire 4. Curing was carried out by holding in a convection oven for 30 minutes at 100° C. and then 1 hour at 150° C. to fabricate a surface mount-type light-emitting diode (LED) device A as shown in FIG. 1. Sixteen of these were fabricated in each instance.

[Initial detachment rate]

The presence/absence of detachment between the heat-cured product from the composition and the inner wall of the polyphthalamide (PPA) housing 1 was observed using an optical microscope for the aforementioned sixteen surface mount-type light-emitting diode (LED) devices A. [The number in which detachment had occurred]16 was used as the detachment rate.

[Detachment rate after holding at constant temperature and constant humidity]

The aforementioned sixteen surface mount-type light-emitting diode (LED) devices A were held for 72 hours in a 30° C/70 RH% atmosphere followed by return to room temperature (25° C.). The presence/absence of detachment between the heat-cured product from the composition and the inner wall of the polyphthalamide (PPA) resin housing 1 was observed using an optical microscope. [The number in which detachment had occurred]/16 was used as the detachment rate.

[Detachment rate after holding for 30 seconds at 280° C.]

After the aforementioned holding at constant temperature and constant humidity, sixteen surface mount-type light-emitting diode (LED) devices A were held for 30 seconds in a 280° C. convection oven followed by return to room temperature (25° C.). The presence/absence of detachment between the heat-cured product from the composition and the inner wall of the polyphthalamide (PPA) resin housing 1 was observed using an optical microscope. [The number in which detachment had occurred]16 was used as the detachment rate.

[Detachment rate after heat shock cycling]

The following temperature cycle (−40° C. to +100° C.) was performed a total of 5 times on sixteen surface mount-type light-emitting diode (LED) devices A after the aforementioned holding for 30 seconds at 280° C.: holding for 30 minutes at −40° C., then holding for 30 minutes at +100° C. After then returning to room temperature (25° C.), the presence/absence of detachment between the heat-cured product from the composition and the inner wall of the polyphthalamide (PPA) resin housing 1 was observed using an optical microscope. [The number in which detachment had occurred]/16 was used as the detachment rate.

Example 1

The following were mixed to uniformity to produce a hydrosilylation reaction-curable organopolysiloxane composition that had a viscosity of 1,250 mPa·s, a diphenylsiloxane unit content in the total siloxane units of 0%, and a total content of 1,3,5-trimethyl-1,3,5-triphenylcyclotrisiloxane and 1,3,5,7-tetramethyl-1,3,5,7-tetraphenylcyclotetrasiloxane of 2.5 weight %:

84 weight parts of a straight-chain dimethylvinylsiloxy-endblocked methylphenylpolysiloxane having a viscosity of 3,500 mPa·s, a silicon-bonded vinyl content of 1.5 weight %, a silicon-bonded phenyl group content in the total silicon-bonded organic groups of 49 mole %, and a diphenylsiloxane unit content in the total siloxane units of 0 mole %;

3 weight parts of a branched organopolysiloxane having the average siloxane unit formula $(PhSiO_{3/2})_{0.4}(HMe_2SiO_{1/2})_{0.6}$ and having a viscosity of 700 mPa·s, a silicon-bonded hydrogen atom content of 0.65 weight %, a silicon-bonded phenyl group content in the total silicon-bonded organic groups of 25 mole %, and a diphenylsiloxane unit content in the total siloxane units of 0 mole %;

13 weight parts of a dimethylhydrogensiloxy-endblocked methylphenylpolysiloxane having the average structural formula $HMe_2SiO(MePhSiO)_4SiMe_2H$ and having a viscosity of 350 mPa·s, a silicon-bonded hydrogen atom content of 0.22 weight %, a silicon-bonded phenyl group content in the total silicon-bonded organic groups of 33.3 mole %, and a diphenylsiloxane unit content in the total siloxane units of 0 mole %;

a platinum/1,3-divinyl-1,1,3,3-tetramethyldisiloxane complex in a quantity that provided the composition with 2.5 weight-ppm platinum metal from this complex; and 0.05 weight part of 2-phenyl-3-butyn-2-ol.

The properties of this hydrosilylation reaction-curable organopolysiloxane composition and the cured product therefrom were measured. The results are reported in Table 1. The reliability evaluations were performed on surface mount-type light-emitting diodes (LED) fabricated using this curable organopolysiloxane composition. These results are reported in Table 2.

Example 2

The following were mixed to uniformity to produce a hydrosilylation reaction-curable organopolysiloxane composition that had a viscosity of 2,300 mPa·s, a diphenylsiloxane unit content in the total siloxane units of 0%, and a total content of 1,3,5-trimethyl-1,3,5-triphenylcyclotrisiloxane and 1,3,5,7-tetramethyl-1,3,5,7-tetraphenylcyclotetrasiloxane of 1.8 weight %:

66 weight parts of a straight-chain dimethylvinylsiloxy-endblocked methylphenylpolysiloxane having a viscosity of 3,500 mPa·s, a silicon-bonded vinyl content of 0.20 weight %, a silicon-bonded phenyl group content in the total silicon-bonded organic groups of 49 mole %, and a diphenylsiloxane unit content in the total siloxane units of 0 mole %;

20 weight parts of a branched organopolysiloxane that had the average siloxane unit formula $(PhSiO_{3/2})_{0.75}(ViMe_2SiO_{1/2})_{0.25}$, that was a solid at 25° C., and that had a silicon-bonded vinyl group content of 5.62 weight %, a silicon-bonded phenyl group content in the total silicon-bonded organic groups of 50 mole %, and a diphenylsiloxane unit content in the total siloxane units of 0 mole %;

13 weight parts of a branched organopolysiloxane having the average siloxane unit formula $(PhSiO_{3/2})_{0.4}(HMe_2SiO_{1/2})_{0.6}$ and having a viscosity of 700 mPa·s, a silicon-bonded hydrogen atom content of 0.65 weight %, a silicon-bonded phenyl group content in the total silicon-bonded organic groups of 25 mole %, and a diphenylsiloxane unit content in the total siloxane units of 0 mole %;

a platinum/1,3-divinyl-1,1,3,3-tetramethyldisiloxane complex in a quantity that provided the composition with 2.5 weight-ppm platinum metal from this complex; and 0.05 weight part of 2-phenyl-3-butyn-2-ol.

The properties of this hydrosilylation reaction-curable organopolysiloxane composition and the cured product therefrom were measured. The results are reported in Table 1. The reliability evaluations were performed on surface mount-type light-emitting diodes (LED) fabricated using this curable organopolysiloxane composition. These results are reported in Table 2.

Example 3

The following were mixed to uniformity to produce a hydrosilylation reaction-curable organopolysiloxane composition that had a viscosity of 2,800 mPa·s, a diphenylsiloxane unit content in the total siloxane units of 0%, and a total content of 1,3,5-trimethyl-1,3,5-triphenylcyclotrisiloxane and 1,3,5,7-tetramethyl-1,3,5,7-tetraphenylcyclotetrasiloxane of 0.4 weight%:

16 weight parts of a straight-chain dimethylvinylsiloxy-endblocked methylphenylpolysiloxane having a viscosity of 3,500 mPa·s, a silicon-bonded vinyl content of 0.20 weight %, a silicon-bonded phenyl group content in the total silicon-bonded organic groups of 49 mole %, and a diphenylsiloxane unit content in the total siloxane units of 0 mole %;

40 weight parts of a branched organopolysiloxane that had the average siloxane unit formula $(PhSiO_{3/2})_{0.75}(ViMe_2SiO_{1/2})_{0.25}$, that was a solid at 25° C., and that had a silicon-bonded vinyl content of 5.62 weight %, a silicon-bonded phenyl group content in the total silicon-bonded organic groups of 50 mole %, and a diphenylsiloxane unit content in the total siloxane units of 0 mole %;

44 weight parts of a dimethylhydrogensiloxy-endblocked methylphenylpolysiloxane having the average structural formula $HMe_2SiO(MePhSiO)_4SiMe_2H$ and having a viscosity of 350 mPa·s, a silicon-bonded hydrogen atom content of 0.22 weight %, a silicon-bonded phenyl content in the total silicon-bonded organic groups of 33.3 mole %, and a diphenylsiloxane unit content in the total siloxane units of 0 mole %;

a platinum/1,3-divinyl-1,1,3,3-tetramethyldisiloxane complex in a quantity that provided the composition with 2.5 weight-ppm platinum metal from this complex; and 0.05 weight part 2-phenyl-3-butyn-2-ol.

The properties of this hydrosilylation reaction-curable organopolysiloxane composition and the cured product therefrom were measured. The results are reported in Table 1. The reliability evaluations were performed on surface mount-type light-emitting diodes (LED) fabricated using this curable organopolysiloxane composition. These results are reported in Table 2.

Comparative Example 1

The following were mixed to uniformity to produce a hydrosilylation reaction-curable organopolysiloxane composition that had a viscosity of 1,350 mPa·s, a diphenylsiloxane unit content in the total siloxane units of 5.3 mole %, and a total content of 1,3,5-trimethyl-1,3,5-triphenylcyclotrisiloxane and 1,3,5,7-tetramethyl-1,3,5,7-tetraphenylcyclotetrasiloxane of 2.3 weight %:

87 weight parts of a straight-chain dimethylvinylsiloxy-endblocked methylphenylpolysiloxane having a viscosity of 3,500 mPa·s, a silicon-bonded vinyl group content of 1.5 weight %, a silicon-bonded phenyl group content in the total silicon-bonded organic groups of 49 mole %, and a diphenylsiloxane unit content in the total siloxane units of 0 mole %;

3 weight parts of a branched organopolysiloxane having the average siloxane unit formula $(PhSiO_{3/2})_{0.4}(HMe_2SiO_{1/2})_{0.6}$ and having a viscosity of 700 mPa·s, a silicon-bonded hydrogen atom content of 0.65 weight %, a silicon-bonded phenyl group content in the total silicon-bonded organic groups of 25 mole %, and a diphenylsiloxane unit content in the total siloxane units of 0 mole %;

10 weight parts of a dimethylhydrogensiloxy-endblocked diphenylpolysiloxane having the average structural formula $HMe_2SiO(Ph_2SiO)_2SiMe_2H$ and having a viscosity of 150 mPa·s, a silicon-bonded hydrogen atom content of 0.32 weight %, a silicon-bonded phenyl group content in the total silicon-bonded organic groups of 50 mole %, and a diphenylsiloxane unit content in the total siloxane units of 50 mole %;

a platinum/1,3-divinyl-1,1,3,3-tetramethyldisiloxane complex in a quantity that provided the composition with 2.5 weight-ppm platinum metal from this complex; and 0.05 weight part of 2-phenyl-3-butyn-2-ol.

The properties of this hydrosilylation reaction-curable organopolysiloxane composition and the cured product therefrom were measured. The results are reported in Table 1. The reliability evaluations were performed on surface mount-type light-emitting diodes (LED) fabricated using this curable organopolysiloxane composition. These results are reported in Table 2.

Comparative Example 2

The following were mixed to uniformity to produce a hydrosilylation reaction-curable organopolysiloxane composition that had a viscosity of 2,350 mPa·s, a diphenylsiloxane unit content in the total siloxane units of 28.5 mole %, and a total content of 1,3,5-trimethyl-1,3,5-triphenylcyclotrisiloxane and 1,3,5,7-tetramethyl-1,3,5,7-tetraphenylcyclotetrasiloxane of 1.8 weight %:

66 weight parts of a straight-chain dimethylvinylsiloxy-endblocked dimethylsiloxane-diphenylsiloxane copolymer having a viscosity of 3,700 mPa·s, a silicon-bonded vinyl group content of 1.48 weight %, a silicon-bonded phenyl group content in the total silicon-bonded organic groups of 49 mole %, and a diphenylsiloxane unit content in the total siloxane units of 49 mole %;

20 weight parts of a branched organopolysiloxane that had the average siloxane unit formula $(PhSiO_{3/2})_{0.75}(ViMe_2SiO_{1/2})_{0.25}$, that was a solid at 25° C., and that had a silicon-bonded vinyl group content of 5.62 weight %, a silicon-bonded phenyl group content in the total silicon-bonded organic groups of 50 mole %, and a diphenylsiloxane unit content in the total siloxane units of 0 mole %;

13 weight parts of a branched organopolysiloxane having the average siloxane unit formula $(PhSiO_{3/2})_{0.4}(HMe_2SiO_{1/2})_{0.6}$ and having a viscosity of 700 mPa·s, a silicon-bonded hydrogen atom content of 0.65 weight %, a silicon-bonded phenyl group content in the total silicon-bonded organic groups of 25 mole %, and a diphenylsiloxane unit content in the total siloxane units of 0 mole %;

a platinum/1,3-divinyl-1,1,3,3-tetramethyldisiloxane complex in a quantity that provided the composition with 2.5 weight-ppm platinum metal from this complex; and 0.05 weight part of 2-phenyl-3-butyn-2-ol.

The properties of this hydrosilylation reaction-curable organopolysiloxane composition and the cured product therefrom were measured. The results are reported in Table 1. The reliability evaluations were performed on surface mount-type light-emitting diodes (LED) fabricated using this curable organopolysiloxane composition. These results are reported in Table 2.

Comparative Example 3

The following were mixed to uniformity to produce a hydrosilylation reaction-curable organopolysiloxane composition that had a viscosity of 3,000 mPa·s, a diphenylsiloxane unit content in the total siloxane units of 17.0 mole %, and a total content of 1,3,5-trimethyl-1,3,5-triphenylcyclotrisiloxane and 1,3,5,7-tetramethyl-1,3,5,7-tetraphenylcyclotetrasiloxane of 0.7 weight %:

27 weight parts of a straight-chain dimethylvinylsiloxy-endblocked methylphenylpolysiloxane having a viscosity of 3,500 mPa·s, a silicon-bonded vinyl group content of 0.20 weight %, a silicon-bonded phenyl group content in the total silicon-bonded organic groups of 49 mole %, and a diphenylsiloxane unit content in the total siloxane units of 0 mole %;

40 weight parts of a branched organopolysiloxane that had the average siloxane unit formula $(PhSiO_{3/2})_{0.75}(ViMe_2SiO_{1/2})_{0.25}$, that was a solid at 25° C., and that had a silicon-bonded vinyl group content of 5.62 weigh %, a silicon-bonded phenyl group content in the total silicon-bonded organic groups of 50 mole %, and a diphenylsiloxane unit content in the total siloxane units of 0 mole %;

33 weight parts of a dimethylhydrogensiloxy-endblocked diphenylpolysiloxane having the average structural formula $HMe_2SiO(Ph_2SiO)_2SiMe_2H$ and having a viscosity of 150 mPa·s, a silicon-bonded hydrogen atom content of 0.32 weight %, a silicon-bonded phenyl group content in the total silicon-bonded organic groups of 50 mole %, and a diphenylsiloxane unit content in the total siloxane units of 50 mole %;

a platinum/1,3-divinyl-1,1,3,3-tetramethyldisiloxane complex in a quantity that provided the composition with 2.5 weight-ppm platinum metal from this complex; and 0.05 weight part of 2-phenyl-3-butyn-2-ol.

The properties of this hydrosilylation reaction-curable organopolysiloxane composition and the cured product therefrom were measured. The results are reported in Table 1. The reliability evaluations were performed on surface mount-type light-emitting diodes (LED) fabricated using this curable organopolysiloxane composition. These results are reported in Table 2.

TABLE 1

|  | Example 1 | Example 2 | Example 3 | Comparative Example 1 | Comparative Example 2 | Comparative Example 3 |
|---|---|---|---|---|---|---|
| refractive index of the composition | 1.542 | 1.538 | 1.535 | 1.545 | 1.538 | 1.543 |

TABLE 1-continued

|  | Example 1 | Example 2 | Example 3 | Comparative Example 1 | Comparative Example 2 | Comparative Example 3 |
|---|---|---|---|---|---|---|
| initial optical transmittance of the cured product | 99.8% | 99.5% | 99.3% | 99.9% | 99.6% | 99.5% |
| optical transmittance of the cured product after holding for 1000 hours at 150° C. | 99.2% | 99.4% | 99.0% | 92.5% | 84.0% | 90.5% |
| hardness of the cured product | A10 | A46 | D45 | A12 | A47 | D43 |
| adhesive strength by the cured product for polyphthalamide resin sheet (MPa) | 3 | 5 | 9 | 3 | 5 | 8 |
| adhesive strength by the cured product for aluminum sheet (MPa) | 4 | 7 | 10 | 3 | 6 | 9 |

Note:
In the results reported for the hardness, A indicates measurement using a type A durometer and D indicates measurement using a type D durometer.

TABLE 2

|  | Example 1 | Example 2 | Example 3 | Comparative Example 1 | Comparative Example 2 | Comparative Example 3 |
|---|---|---|---|---|---|---|
| initial detachment rate of the cured product | 0% | 0% | 0% | 0% | 0% | 0% |
| detachment rate after holding at constant temperature and constant humidity | 0% | 0% | 0% | 0% | 0% | 6.3% |
| detachment rate after holding for 30 seconds at 280° C. | 0% | 0% | 0% | 0% | 12.5% | 12.5% |
| detachment rate after heat shock cycling | 0% | 6.3% | 0% | 25% | 75% | 25% |

INDUSTRIAL APPLICABILITY

The hydrosilylation reaction-curable organopolysiloxane composition of the present invention—because it forms a cured product that exhibits a high refractive index, a high optical transmittance, and a high resistance to discoloration and that additionally exhibits a highly durable adhesion for substrates—is useful as adhesives, potting agents, encapsulants, protective coating agents, and underfills for electrical and electronic applications.

The optical semiconductor element sealant of the present invention—because it forms a cured product that exhibits a high refractive index, a high optical transmittance, and a high resistance to discoloration and that additionally exhibits a highly durable adhesion for substrates—is useful, as a sealants, including potting agents, encapsulants, protective coating agents, and underfills, for optical semiconductor elements and optical semiconductor devices and as adhesives, including die bonding agents, for optical semiconductor elements and optical semiconductor devices. The optical semiconductor device of the present invention—because an optical semiconductor element therein is sealed, specifically encapsulated with a cured product from the optical semiconductor element sealant, specifically encapsulant described above—is useful as an optical semiconductor device such as an optical device, an optical apparatus or instrument, a lighting apparatus, a lighting device, and so forth.

DESCRIPTION OF THE REFERENCE CHARACTERS

A surface mount-type light-emitting diode (LED) device
1 polyphthalamide (PPA) resin housing
2 light-emitting diode (LED) chip
3 inner lead
4 bonding wire
5 cured product from the optical semiconductor element encapsulant
6 die pad

The invention claimed is:
1. A hydrosilylation reaction-curable organopolysiloxane composition comprising
 (A) a methylphenylalkenylpolysiloxane that has at least two silicon-bonded alkenyl groups per molecule, wherein diphenylsiloxane units are no more than 5 mole % of the total siloxane units and phenyl groups are at least 20 mole % of the total silicon-bonded organic groups in the molecule,
 (B) a methylphenylhydrogenpolysiloxane that has at least two silicon-bonded hydrogen atoms per molecule, wherein diphenylsiloxane units are no more than 5 mole % of the total siloxane units and phenyl groups are at least 20 mole % of the total silicon-bonded organic groups in the molecule, and
 (C) a hydrosilylation reaction catalyst, wherein the diphenylsiloxane units are no more than 5 mole % of the total siloxane units in this composition.

2. The hydrosilylation reaction-curable organopolysiloxane composition according to claim 1, wherein
component (A) is represented by average unit formula (1):

$$R_a SiO_{(4-a)/2} \quad (1)$$

wherein R is $C_2$ to $C_8$ alkenyl, methyl, and phenyl, at least 20 mole % thereof is comprised of phenyl groups, and a is a positive number from 0.5 to 2.2; and
component (B) is represented by average unit formula (5):

$$R^1_b H_c SiO_{(4-b-c)/2} \quad (5)$$

wherein $R^1$ is methyl and phenyl, at least 20 mole % thereof is comprised of phenyl groups, b is a positive number from 1.0 to 2.2, and c is a positive number from 0.002 to 1.0.

3. The hydrosilylation reaction-curable organopolysiloxane composition according to claim 2, wherein component (A) is a mixture of
(A1) a methylphenylalkenylpolysiloxane represented by average unit formula (2):

$$R_d SiO_{(4-d)/2} \quad (2)$$

wherein R is $C_2$ to $C_8$ alkenyl, methyl, and phenyl, at least 20 mole % thereof is comprised of phenyl groups, and d is a positive number from 1.9 to 2.2 that has at least two silicon-bonded $C_2$ to $C_8$ alkenyl groups per molecule, is liquid at ambient temperature and has a viscosity at 25° C. of 10 to 100,000 mPa·s, with the proviso that diphenylsiloxane units are no more than 5 mole % of the total siloxane units therein, and
(A2) an organopolysiloxane resin represented by average unit formula (3):

$$R_e SiO_{(4-e)/2} \quad (3)$$

wherein R is $C_2$ to $C_8$ alkenyl, methyl, and phenyl, at least 20 mole % thereof is comprised of phenyl groups, and e is a positive number from 0.5 to 1.7 that is a solid at ambient temperature and has at least two silicon-bonded alkenyl groups per molecule, with the proviso that diphenylsiloxane units are no more than 5 mole % of the total siloxane units therein,
wherein component (A1) is 99 to 30 weight % of the mixture and component (A2) is 1 to 70 weight % of the mixture and their total is 100 weight %.

4. The hydrosilylation reaction-curable organopolysiloxane composition according to claim 1, wherein neither component (A) nor component (B) contains the diphenylsiloxane unit.

5. The hydrosilylation reaction-curable organopolysiloxane composition according to claim 3, wherein neither component (A1) nor component (A2) nor component (B) contains the diphenylsiloxane unit.

6. The hydrosilylation reaction-curable organopolysiloxane composition according to claim 1, wherein said composition forms a cured product that has an optical transmittance of at least 99% in a quartz cell at a wavelength of 450 nm and an optical path length of 0.2 cm and that has a refractive index at 25° C. for visible light at 589 nm of at least 1.5.

7. The hydrosilylation reaction-curable organopolysiloxane composition according to claim 3, wherein said composition forms a cured product that has an optical transmittance of at least 99% in a quartz cell at a wavelength of 450 nm and an optical path length of 0.2 cm and that has a refractive index at 25° C. for visible light at 589 nm of at least 1.5.

8. The hydrosilylation reaction-curable organopolysiloxane composition according to claim 6, wherein the cured product has an optical transmittance of at least 98% at 25° C. at an optical path length of 0.2 cm and a wavelength of 450 nm after the cured product has been held for 1000 hours in a convection oven at 150° C.

9. An optical semiconductor element sealant comprising the hydrosilylation reaction-curable organopolysiloxane composition according to claim 6.

10. An optical semiconductor element sealant comprising the hydrosilylation reaction-curable organopolysiloxane composition according to claim 7.

11. The optical semiconductor element sealant according to claim 9, wherein said sealant forms a cured product that has an optical transmittance at 25° C. of at least 99% at a wavelength of 450 nm and an optical path length of 0.2 cm, wherein this cured product has an optical transmittance at 25° C. of at least 98% at a wavelength of 450 and an optical path length of 0.2 cm after the cured product has been held for 1000 hours in a convection oven at 150° C.

12. An optical semiconductor device, wherein the optical semiconductor element of an optical semiconductor device comprising an optical semiconductor element in a housing is sealed with the transparent cured product from the optical semiconductor element sealant according to claim 9 by filling the optical semiconductor element sealant into the housing and curing.

13. The optical semiconductor device according to claim 12, wherein the optical semiconductor element is a light-emitting diode element and the optical semiconductor device is a light-emitting diode device.

14. The optical semiconductor device according to claim 12, wherein the housing is composed of a polar group-containing plastic.

15. The optical semiconductor device according to claim 14, wherein the polar group-containing plastic is a polyphthalamide resin.

16. The hydrosilylation reaction-curable organopolysiloxane composition according to claim 1, wherein a total content of 1,3,5-trimethyl-1,3,5-triphenylcyclotrisiloxane and 1,3,5,7-tetramethyl-1,3,5,7-tetraphenylcyclotetrasiloxane is no more than 5 weight %.

17. The optical semiconductor element sealant according to claim 9, wherein a total content of 1,3,5-trimethyl-1,3,5-triphenylcyclotrisiloxane and 1,3,5,7-tetramethyl-1,3,5,7-tetraphenylcyclotetrasiloxane is no more than 5 weight %.

18. An optical semiconductor device, wherein the light-emitting semiconductor element of an optical semiconductor device comprising an optical semiconductor element in a housing is sealed with the transparent cured product from the optical semiconductor element sealant according to claim 17 by filling the optical semiconductor element sealant into the housing and curing.

* * * * *